United States Patent
Wang et al.

(10) Patent No.: US 9,412,838 B2
(45) Date of Patent: Aug. 9, 2016

(54) ION IMPLANTATION METHODS AND STRUCTURES THEREOF

(71) Applicant: TAIWAN SEMICONDUCTOR MANUFACTURING COMPANY, LTD., Hsin-Chu (TW)

(72) Inventors: Tsan-Chun Wang, Hsinchu (TW); Chun Hsiung Tsai, Xinpu Township, Hsinchu County (TW); Ziwei Fang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/502,381

(22) Filed: Sep. 30, 2014

(65) Prior Publication Data

US 2016/0093714 A1  Mar. 31, 2016

(51) Int. Cl.
| | |
|---|---|
| *H01L 21/336* | (2006.01) |
| *H01L 29/66* | (2006.01) |
| *H01L 27/088* | (2006.01) |
| *H01L 21/8234* | (2006.01) |
| *H01L 21/66* | (2006.01) |
| *H01L 21/266* | (2006.01) |
| *H01L 21/324* | (2006.01) |
| *H01L 29/10* | (2006.01) |
| *H01L 29/167* | (2006.01) |
| *H01L 21/265* | (2006.01) |
| *H01L 29/32* | (2006.01) |

(52) U.S. Cl.
CPC ........ *H01L 29/66537* (2013.01); *H01L 21/266* (2013.01); *H01L 21/26513* (2013.01); *H01L 21/324* (2013.01); *H01L 21/823431* (2013.01); *H01L 22/30* (2013.01); *H01L 27/0886* (2013.01); *H01L 29/1083* (2013.01); *H01L 29/167* (2013.01); *H01L 29/32* (2013.01)

(58) Field of Classification Search
USPC .......................................................... 438/283
See application file for complete search history.

(56) References Cited

U.S. PATENT DOCUMENTS

| | | | | |
|---|---|---|---|---|
| 2007/0221956 | A1* | 9/2007 | Inaba | ............. H01L 21/823807 257/197 |
| 2013/0173214 | A1* | 7/2013 | Yamashita | ............. G01B 7/023 702/170 |
| 2015/0214339 | A1* | 7/2015 | Waite | ................ H01L 29/66803 438/517 |

OTHER PUBLICATIONS

Tsan-Chun Wang; Zi-Wei Fang and Tze-Liang Lee; "Tilt Implantation for Forming Finfets;" U.S. Appl. No. 14/029,848, filed Sep. 18, 2013; 29 Pages.

* cited by examiner

*Primary Examiner* — Timor Karimy
(74) *Attorney, Agent, or Firm* — Haynes and Boone, LLP (57) ABSTRACT

A method for fabricating a semiconductor device using a high-temperature ion implantation process includes providing a substrate including a plurality of fins. In some examples, a mask material is deposited and patterned to expose a group of fins of the plurality of fins and a test structure. By way of example, a first ion implantation may be performed, at a first temperature, through the group of fins and the test structure. Additionally, a second ion implantation may be performed, at a second temperature greater than the first temperature, through the group of fins and the test structure. In various examples, an interstitial cluster is formed within the group of fins and within the test structure. In some embodiments, an anneal process is performed, where the anneal process serves to remove the interstitial cluster from the group of fins and form at least one dislocation loop within the test structure.

20 Claims, 11 Drawing Sheets

ION IMPLANTATION METHODS AND STRUCTURES THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, ion implantation of dopants through fins of FinFET devices, as done in current fabrication methods, directly contributes to the formation of defects and the introduction of impurities in a FinFET channel region. Such channel defects and impurities can cause scattering of carriers flowing through the FinFET channel, thus degrading channel mobility and adversely affecting device performance. Dopant implantation through FinFET fins may also result in a non-uniform doping profile, which among other issues can cause variability of FinFET device parameters. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Figure 1A:
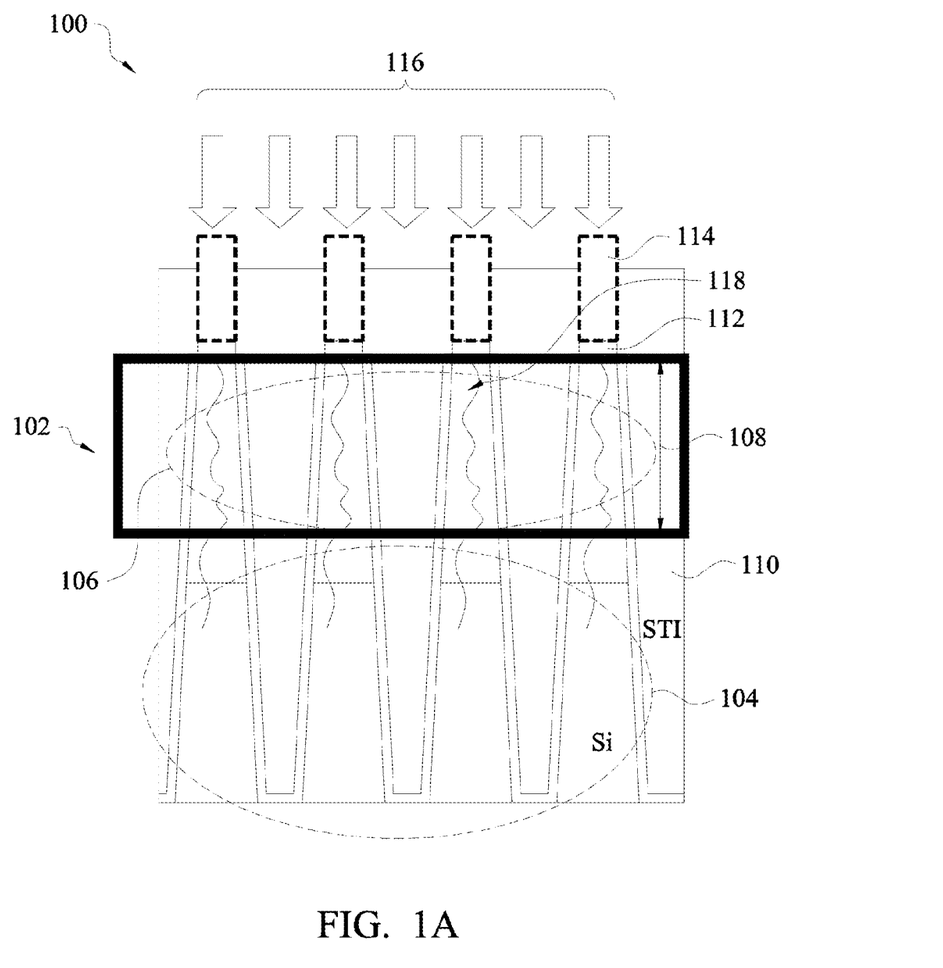
FIGS. 1A and 1B are schematic cross-sectional views of multi-gate device structures illustrating damage caused by conventional ion implantation processes.
Figure 1B:
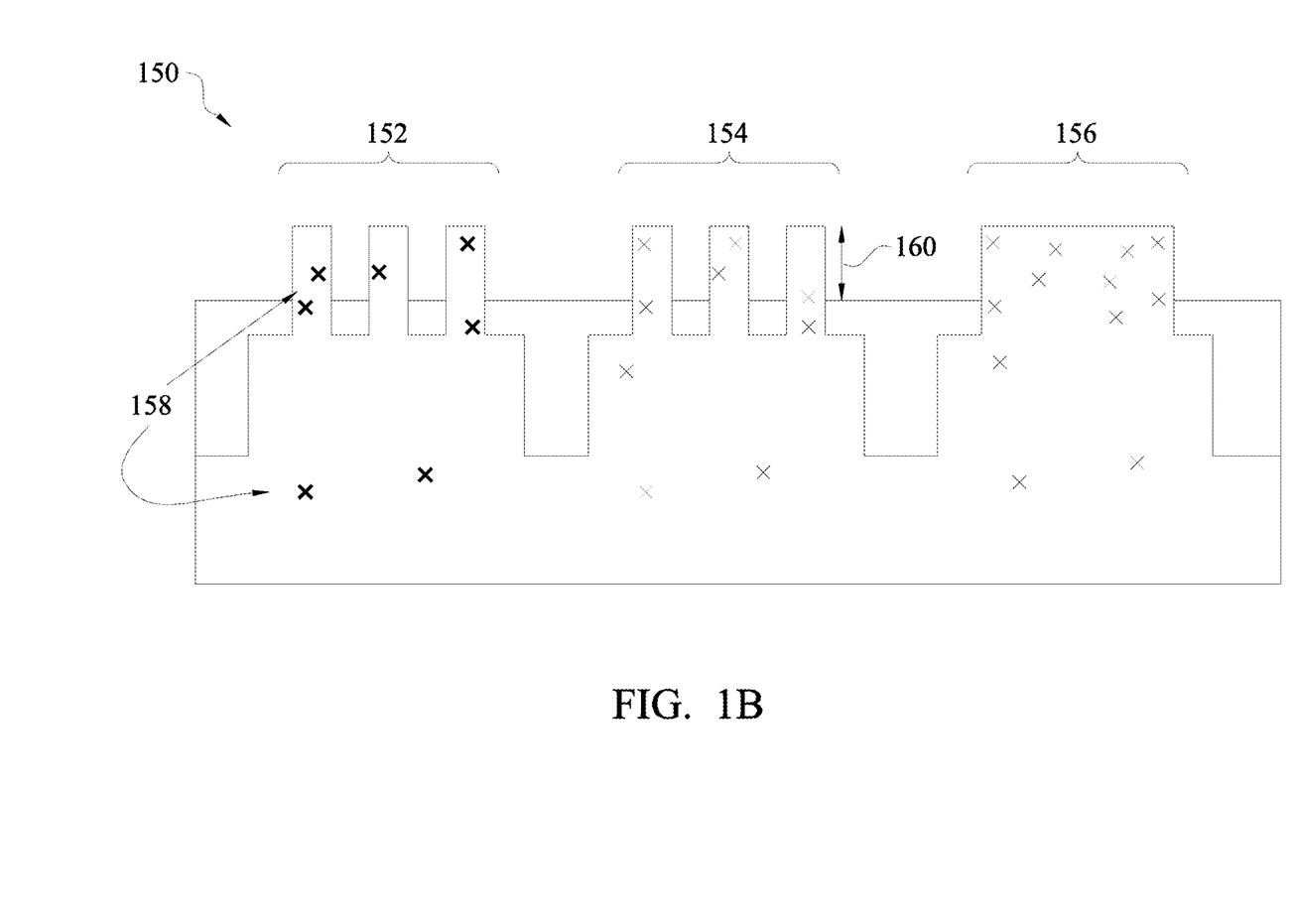

Illustrated in FIGS. 1A and 1B are schematic cross-sectional views of multi-gate device structures 100 and 150, respectively. In some examples, each of the multi-gate device structures 100, 150 may include FinFET devices. The multi-gate device structures 100, 150 are briefly described, with reference to FIGS. 1A/1B, for the purpose of providing context and clarity to the discussion that follows. In particular, the multi-gate device structures 100, 150 are presented to illustrate damage caused to such devices by conventional ion implantation processes. Referring first to the example multi-gate device structure 100 of FIG. 1A, illustrated therein are a plurality of fin elements 102 which may be used for the formation of FinFET devices. In some examples, each of the fin elements 102 includes a well region 104 and a channel region 106, where the channel region 106 may further include a height 108. In various examples, each of the fin elements 102 are electrically isolated from each other by way of a shallow trench isolation (STI) region 110 disposed between the fin elements 102. In addition, each of the plurality of fin elements 102 may include a first dielectric 112 formed over the fin elements 102, and a second dielectric 114 formed over the first dielectric 112. In some examples, the first dielectric 112 includes a pad oxide layer (e.g., $SiO_2$) which may be used as a buffer layer between adjacent layers. In some cases, second dielectric layer includes a pad nitride layer (e.g., $Si_3N_4$).

During the fabrication of the multi-gate structure 100, one or more ion implantation processes 116 may be performed through the fin elements 102, using a suitable N-type or P-type dopant. In some examples, the one or more ion implantation processes 116 may include a well isolation implant, an anti-punch-through (APT) implant, a diffusion control implant, a threshold voltage ($V_t$) adjust implant, a halo implant, or other suitable implant. As illustrated in FIG. 1A, the energetic ion beams employed to perform the one or more ion implantation processes 116 may result in damage to the substrate material into which, or through which, such ion beam are injected. In the example of FIG. 1A, the one or more ion implantation processes 116 performed through the fin elements 102 results in crystalline damage 118 to the fin elements 102, including damage to the FinFET channel region 106. In addition to the crystalline damage 118, implantation through the channel region 106 can lead to a residual dopant concentration within the channel region 106. Such crystalline damage 118 and residual dopant concentration in the channel region 106 can lead to carrier scattering and mobility degradation, resulting in degraded device performance. Although a high temperature anneal may be used in an attempt to remove such defects (as well as for dopant activation), all defects introduced by ion implantation may not be removed and the substrate (or fin elements 102) may thus not be fully restored to its pre-ion implant condition.

In some embodiments, and with reference to the example of FIG. 1B, the multi-gate device structure 150 may include N-type fins 152 and P-type fins 154, which may be used for the formation of FinFET devices. In addition, the multi-gate structure 150 may include one or more large-area test structures 156. As used herein, "large-area" is used to describe features substantially greater in size than a fin size used for an active FinFET device (e.g., around 10-20 nm). For example, in some cases, the test structure 156 includes a secondary ion mass spectrometry (SIMS) test pad having an area of about 200 $\mu m^2$. In other examples, the test structure 156 may include a large-area fin element having at least one of a fin length or fin width greater than about 100 nm. The multi-gate structure 150, as shown in FIG. 1B, may include a structure after a fin recess process, resulting in exposure of a top portion of each of the N- and P-type fins 152, 154 and test structure 156. By way of example, a fin height 160 of each of the N- and P-type fins 152, 154 may be substantially the same as the height 108 described with reference to FIG. 1A. In various examples, each of the N- and P-type fins 152, 154 may be implanted using separate process steps. For example, in some cases, a photoresist layer may be patterned (e.g., using a lithography process) to expose one fin type (N- or P-type), where the patterned photoresist layer serves as a masking layer for one fin type while the other fin type is implanted. In particular, as described above with reference to FIG. 1A, conventional ion implantation processes can cause crystalline damage 158 to the substrate into which, or through which, such ion beam are injected. In the example of FIG. 1B, one or more ion implantation processes (such as the implantation processes 116 of FIG. 1A) performed through the N-type fins 152, P-type fins 154, and test structure 156 results in crystalline damage 158. In some examples, the crystalline damage 158 includes residual damage which remains even after a well anneal process which may be used to try to reduce such damage. Moreover, as shown in FIG. 1B, the crystalline damage 158 may include damage to channel regions of each of the N-type and P-type fins 152, 154. As described above, such crystalline damage 158, including any residual dopant concentration in the channel regions or the N-type or P-type fins 152, 154, can result in degraded device performance.

The integration of ion implantation processes into highly scaled, advanced fabrication processes (and thus into advanced transistor devices such as FinFET devices), has introduced considerable new challenges. At least one such challenge is associated with the crystalline damage and residual dopant concentration (e.g., within a FinFET channel region), as described above. In addition, as device geometries continue to scale-down, short-channel effects (SCEs) become an increased concern and reliability issue. To counteract at least some SCEs, such as punch-through and drain-induced barrier lowering (DIBL), anti-punch-through (APT) implants have been introduced. Yet, as discussed above, APT implants performed through a FinFET channel region may lead to undesirable damage and/or residual dopant concentrations. Additionally, in some cases, APT implants may require a higher dose to more effectively reduce SCEs. However, increasing the APT implant dose is not possible without paying the penalty of mobility degradation, for example, due to the damage and residual dopant concentration caused by conventional ion implantation processes.

Embodiments of the present disclosure offer advantages over the existing art, though it is understood that other embodiments may offer different advantages, not all advantages are necessarily discussed herein, and no particular advantage is required for all embodiments. For example, embodiments discussed herein include ion implantation methods for multi-gate device structures (e.g., FinFET device structures) and related device structures. In some embodiments, a high-temperature ion implantation process is used to reduce and/or eliminate the crystalline damage to, and/or the residual dopant concentration within, a FinFET channel region. By doing so, embodiments of the present disclosure provide for enhanced device performance such as increased ON-state current, reduced series resistance, increased mobility, and reduced OFF-state current. In various embodiments, the high-temperature ion implantation process includes an ion implantation process performed at a temperature above room temperature (e.g., above around 25° C.) and within a range of about 80-500° C. In some embodiments, such high-temperature implants allow for the use of APT implants with a higher dose than may be used in a conventional APT implant process to more effectively reduce SCEs. Conventional ion implantation processing techniques may use patterned photoresist, as described above, to implant one fin type (e.g., N- or P-type fin) while masking the other type of fin. However, conventional resists used in standard processing techniques are generally not stable beyond around 100° C., after which they may harden, crack, and become difficult to remove from a substrate surface. Thus, embodiments of the present disclosure also provide for the use of a high-temperature mask (HTM) material suitable for use with the high-temperature ion implantation processes disclosed herein. In some embodiments, the HTM material includes topaz. However, in various examples, other heat-endurable materials may also be used (e.g., oxides, nitrides, etc.) as the HTM material without departing from the scope of the present disclosure. Those skilled in the art will recognize other benefits and advantages of the methods and devices as described herein, and the embodiments described are not meant to be limiting beyond what is specifically recited in the claims that follow.

Figure 2:
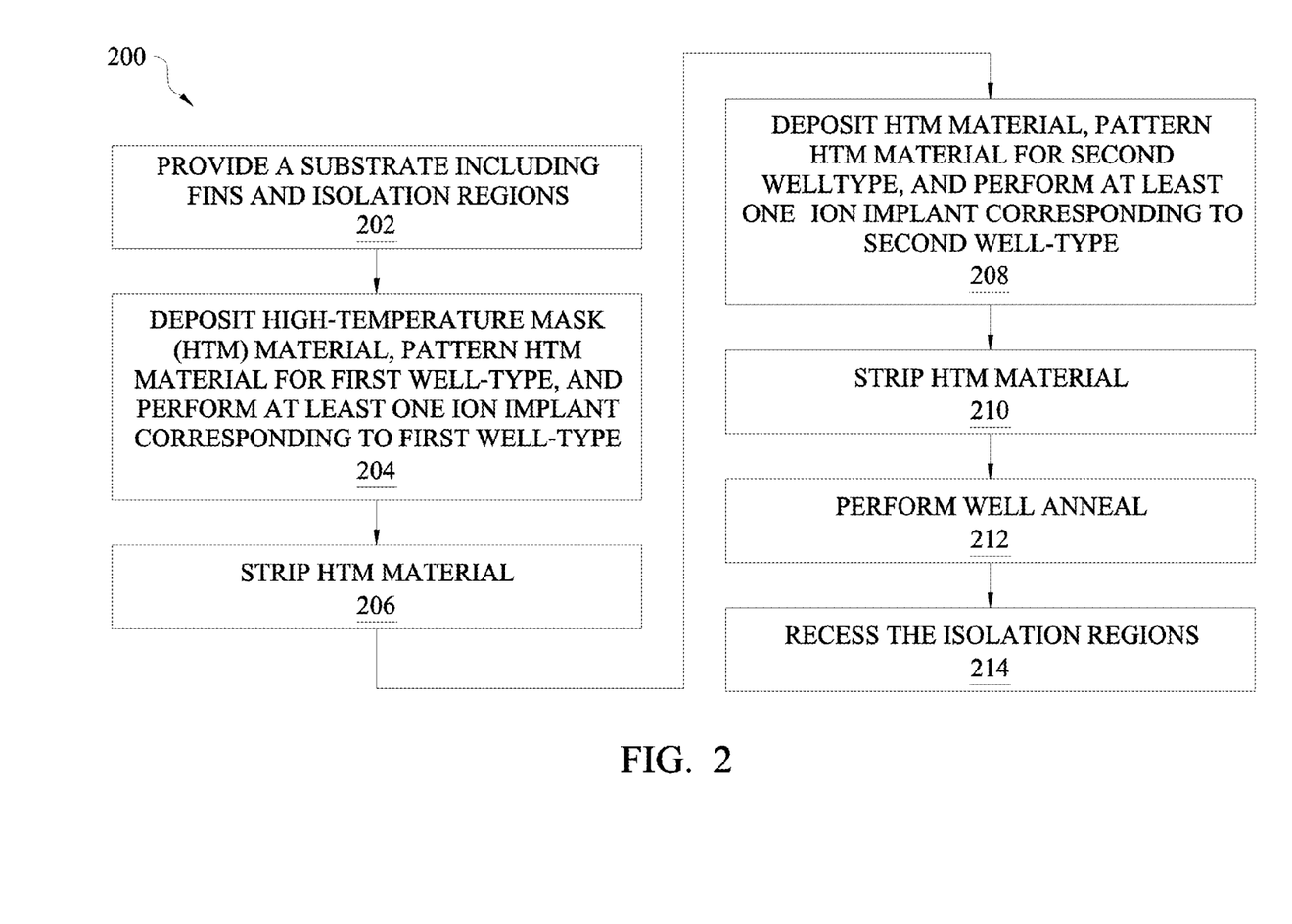
FIG. 2 is a flow chart of a method for performing a high-temperature ion implantation process, according to one or more aspects of the present disclosure.

Referring now to FIG. 2, illustrated is a method 200 of performing a high-temperature ion implantation process, for example, within a FinFET device. Though described in the context of a FinFET device, it is understood that the method 200 may apply to other structures of transistors including, for example, planar transistors or other multi-gate transistors. In some embodiments, the method 200 may be used to fabricate a semiconductor device structure 300, described below with reference to FIGS. 3-9. One or more aspects discussed above with reference to the multi-gate device structures 100, 150 of FIGS. 1A/1B may also apply to the method 200 and to the device structure 300. Additionally, FIGS. 3-9 provide cross-sectional views of the exemplary semiconductor device structure 300 fabricated according to one or more steps of the method 200 of FIG. 2.

It is understood that parts of the method 200 and/or the device structure 300 may be fabricated by a well-known complementary metal-oxide-semiconductor (CMOS) technology process flow, and thus some processes are only briefly described herein. Further, the device structure 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device structure 300 includes a plurality of semiconductor devices (e.g., transistors), which may be interconnected.

The device structure 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. Moreover, it is noted that the process steps of method 200, including any descriptions given with reference to FIGS. 3-9, are merely exemplary and are not intended to be limiting beyond what is specifically recited in the claims that follow.

The method 200 begins at block 202 where a substrate including fins and isolation regions is provided. In some embodiments, the substrate may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

In various embodiments, the substrate includes a plurality of fins extending therefrom. The fins, like the substrate, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, pattering the resist to form the making element may be performed using an electron beam (e-beam) lithography process. The masking element may then be used to protect regions of the substrate while an etch process forms recesses into the silicon layer, thereby leaving an extending fin. The recesses may be etched using a dry etch (e.g., reactive ion etching), a wet etch, and/or other suitable processes. Numerous other embodiments of methods to form the fins on the substrate may also be used.

Figure 3:
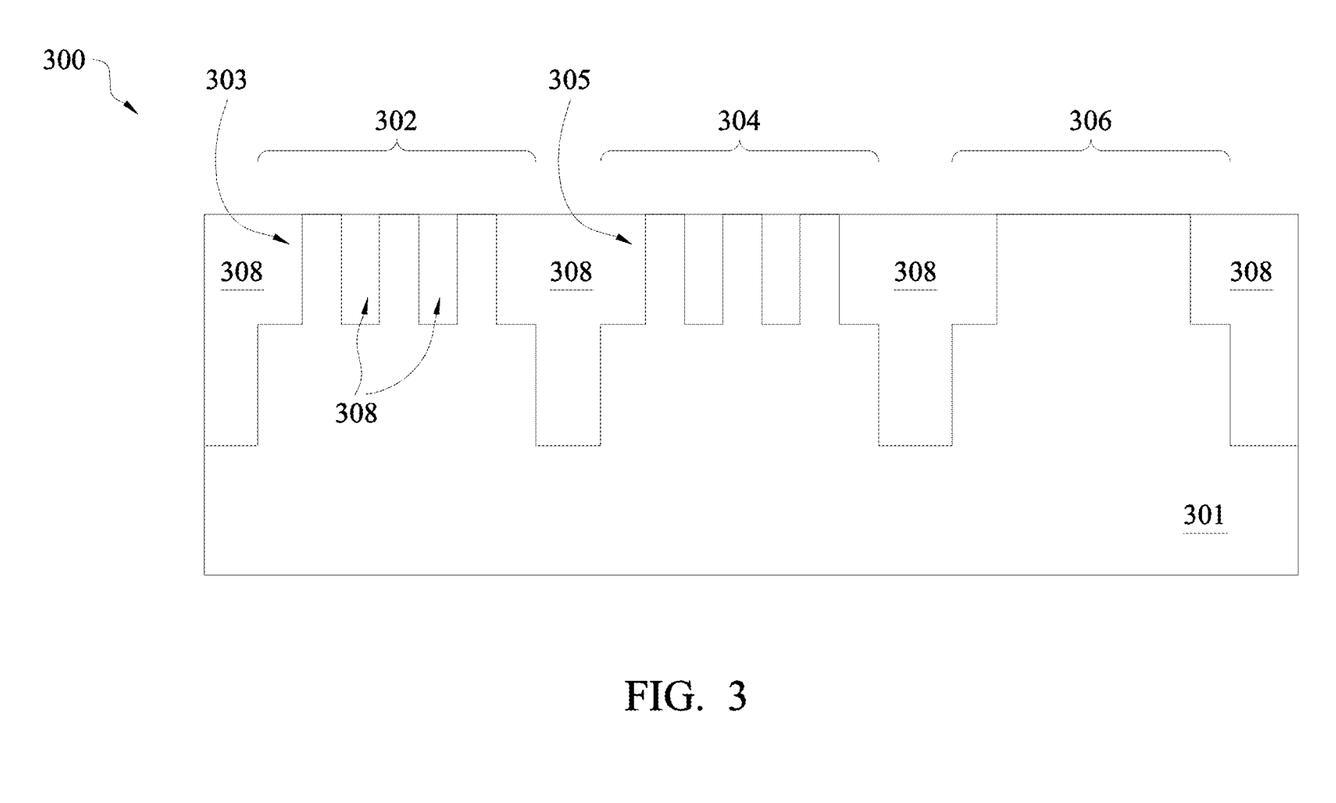
FIGS. 3-9 illustrate cross-sectional views of an embodiment of a device 300 fabricated according to one or more aspects of the method of FIG. 2.
Figure 4:
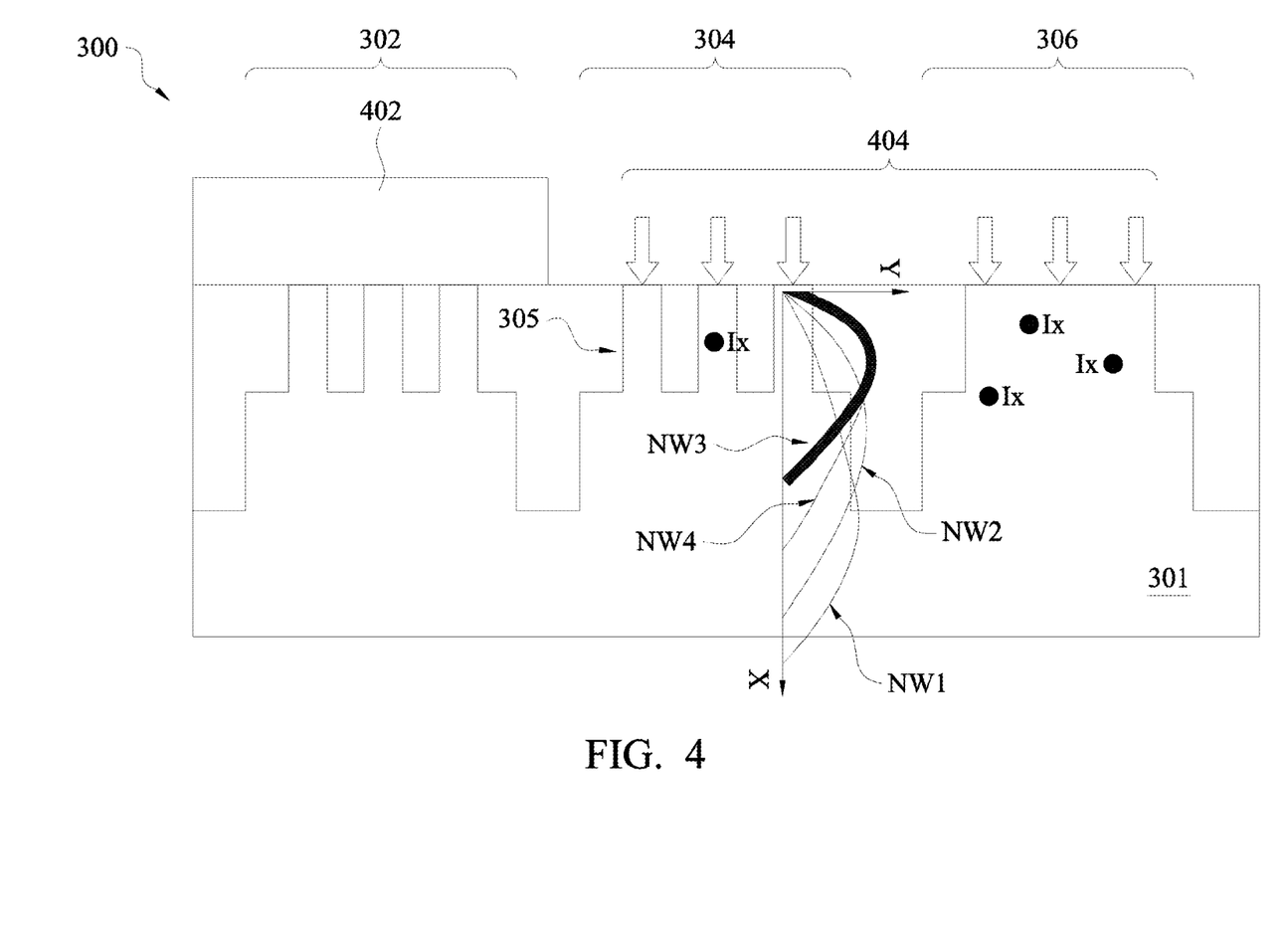

Referring to the example of FIG. 3, and in an embodiment of block 202, illustrated therein is a semiconductor device structure 300 formed on a substrate 301. In some embodiments, the device structure 300 includes an N-type fin region 302 (e.g., for the fabrication of N-type field effect transistors (NFETs)) having a plurality of fins 303, and a P-type fin region 304 (e.g., for the fabrication of P-type field effect transistors (PFETs)) having a plurality of fins 305. In some embodiments, the device structure 300 may also include one or more large-area test structures 306. In some embodiments, the test structure 306 may include a large-area fin element, a secondary ion mass spectrometry (SIMS) test pad, or other test structure as known in the art. In various examples, each of the N- and P-type fin regions 302, 304 may be implanted using separate ion implantation steps at a later stage of device fabrication, as discussed below with reference to FIGS. 4 and 6.

As shown in the example of FIG. 3, the semiconductor device structure 300 may also include isolation regions 308. In some embodiments, the isolation regions 308 may include one or more shallow trench isolation (STI) features. As described above, the plurality of fin elements 303, 305, and in some embodiments the test structure 306, may be patterned by photolithography or e-beam lithography, followed by etching using a dry etch (e.g., RIE), wet etch, or other suitable process. The etching process defines the plurality of fins 303, 305 extending from the substrate 301 as well as trenches disposed between the plurality of fins 303, 305. In some embodiments, a dielectric material used to form the isolation regions 308 is deposited over the substrate 301, filling the trenches with the dielectric. In some embodiments, the dielectric used to form the isolation regions 308 includes $SiO_2$, silicon nitride, silicon oxynitride, fluorine-doped silicate glass (FSG), a low-k dielectric, other suitable materials, or combinations thereof, and/or other suitable material known in the art. The dielectric used in the formation of the isolation regions 308 may be deposited by CVD, ALD, PVD, or other suitable process. In some embodiments, the dielectric used in the formation of the isolation regions 308 is annealed to improve the quality of the dielectric. In some embodiments, a field oxide, a LOCOS feature, and/or other suitable isolation features may be implemented on and/or within the substrate. However, other embodiments are possible.

In some embodiments, after deposition of the dielectric used to form the isolation regions 308, a chemical mechanical polishing (CMP) process is performed to thin and planarize the isolation regions 308. With reference to the example of FIG. 3, the semiconductor device 300 is illustrated at an intermediate processing stage after a CMP process has been performed to remove excess dielectric material and planarize a top surface of the device 300. In various embodiments, the isolation regions 308 are configured to isolate the plurality of fins (e.g., fins 303, 305), and the test structure 306, from each other. In some embodiments, the isolation regions 308 interposing the fins 303, 305, and the test structure 306, may include a multi-layer structure, for example, having one or more liner layers.

In some embodiments, a first dielectric layer may be formed over each of the fins 303, 305 and a second dielectric layer may be formed over the first dielectric layer. In some embodiments, the first dielectric layer includes a pad oxide layer (e.g., $SiO_2$) which may be used as a buffer layer between adjacent layers. In some embodiments, the first dielectric layer includes thermally grown oxide, CVD-deposited oxide, and/or ALD-deposited oxide. By way of example, the first dielectric layer may have a thickness of between approximately 5 nm and approximately 40 nm. In some embodiments, the second dielectric layer includes a pad nitride layer (e.g., $Si_3N_4$). The second dielectric layer may be deposited by CVD or other suitable technique, and in some examples the second dielectric layer may have a thickness of between approximately 20 nm and approximately 160 nm.

The method 200 then proceeds to block 204 where a high-temperature mask (HTM) material, suitable for use with a high-temperature ion implantation process as described herein, is deposited and patterned. Referring to the example of FIG. 4, in an embodiment of block 204, an HTM layer 402 is deposited and patterned. In some embodiments, the HTM layer 402 includes topaz. In some examples, the HTM layer 402 includes another heat-endurable material such as for example, an oxide, a nitride, or other heat-endurable material as known in the art. In the embodiments described herein, the HTM layer 402 is thermally stable up to a temperature of about 550° C. Thus, the HTM layer 402 is suitable for embodiments of the high-temperature ion implantation processes described herein, where one or more ion implantation processes may be performed at a temperature above room temperature (e.g., above around 25° C.) and within a range of about 80-500° C. By way of example, consider the case of using topaz as the HTM layer 402. In addition to the good thermal stability of topaz (up to about 550° C.), topaz is dense and provides uniform step coverage while being free of micro-loading effects, having excellent gap-filling capability, and the ability to be readily removed in an oxygen ($O_2$) plasma or hydrogen ($H_2$) plasma. In some embodiments, the HTM layer 402 may be deposited by CVD, ALD, PVD, or other suitable process. In some examples, where topaz is used as the HTM layer 402, the HTM layer 402 may be deposited by a plasma-enhanced CVD (PECVD) process using at least one of acetylene ($C_2H_2$), ethane ($C_2H_6$), or methane ($CH_4$), together with a mixture of ammonia ($NH_3$)/hydrogen ($H_2$) as a precursor gas. In various embodiments, and depending on an ion implantation energy that is to be used in a subsequent process step, a thickness of the HTM layer 402 may be in a range of about 5-200 nm.

After deposition of the HTM layer 402, the HTM layer 402 is patterned according to a first well-type that is to be implanted. For example, in some embodiments, the first well-type to be implanted includes an N-type well (NWELL), where P-type FinFETs (PFETs) will be fabricated. In some cases, the first well-type to be implanted includes a P-type well (PWELL), where N-type FinFETs (NFETs) will be fabricated. Still referring to the example of FIG. 4, in an embodiment of block 204, the HTM layer 402 is patterned, using a suitable photolithography and etch process, such that the N-type fin region 302 (for NFETs/PWELL) is protected by the HTM layer 402, while the P-type fin region 304 (for PFETs/NWELL) is exposed. In some embodiments, the photolithography process used to pattern the HTM layer 402 may include forming a photoresist layer (resist) over the HTM layer 402, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate (i.e., the N-type fin region 302) while an etch process etches the HTM layer 402 in regions not protected by the masking layer (i.e., the P-type fin region 304). In some embodiments, the HTM layer 402 be etched using a dry etch (e.g., reactive ion etching), a wet etch, and/or other suitable processes. In embodiments including topaz as the HTM layer 402, the HTM layer 402 may be etched using an oxygen ($O_2$) plasma or hydrogen ($H_2$) plasma.

Still referring to block 204 of the method 200, block 204 further includes performing at least one ion implant corresponding to the first well-type by which the HTM layer 402 was patterned. With reference to the example of FIG. 4, which illustrates the HTM layer 402 patterned for an NWELL implant process (i.e., N-type fin region 302 is protected and the P-type fin region 304 is exposed), one or more NWELL ion implantation processes 404 are performed. For purposes of illustration, the example of FIG. 4 includes (X, Y) coordinate axes superimposed over the semiconductor device 300 to illustrate relative depths (in the X-direction) and magnitudes (in the Y-direction) for each of four NWELL implants (NW1, NW2, NW3, NW4). In some embodiments, at least one of the four NWELL implants (NW1, NW2, NW3, NW4) is performed at a temperature above room temperature (e.g., above around 25° C.) and within a range of about 80-500° C. Moreover, in the embodiments described herein, the HTM layer 402 is thermally stable within the range of temperatures (e.g., around 80-500° C.) that the device 300 may be subjected to during such high-temperature implantation processes. In various embodiments, the implants are performed in order of highest implant energy to lowest implant energy. In some embodiments, implant NW1 is performed first, implant NW2 is performed second, implant NW3 is performed third, and implant NW4 is performed fourth. By way of example, and in some embodiments, implants NW1 and NW2 include well isolation implants, NW3 includes an anti-punch-through (APT) implant, and NW4 includes a diffusion control implant. In some embodiments, implant NW1 includes a phosphorous implant performed at room temperature (around 25° C.). In some examples, implant NW2 includes a phosphorous implant performed at room temperature and at a lower energy than that used for implant NW1. In some embodiments, implant NW3 includes a phosphorous implant performed within a temperature range of between about 80-500° C. and at a lower energy than that used for NW2. In some examples, implant NW4 includes a fluorine implant performed at room temperature and having a lower energy than that used for NW3. While some examples of implant conditions for each of the four NWELL implants (NW1, NW2, NW3, NW4) have been provided, it will be understood that other implant energies, dopant species, temperatures, and doses may be used without departing from the scope of the present disclosure. For example, in some embodiments, one of more of the four NWELL implants (NW1, NW2, NW3, NW4) may include other N-type dopant species such as arsenic, phosphorous, antimony, or other N-type material. In addition, in some embodiments, one or more of the four NWELL implants (NW1, NW2, NW3, NW4) may be used to perform an APT implant, a threshold voltage ($V_t$) adjust implant, a halo implant, or other suitable implant.

In conventional processes, the APT implant in particular can have a significant impact on device performance. Thus, in the various embodiments disclosed herein, at least the APT implant (NW3) may be performed at a high-temperature (e.g., around 80-500° C.) to reduce and/or eliminate crystalline damage and/or residual dopant concentration within a FinFET channel. However, in some embodiments, one or more of the other implants (NW1, NW2, or NW4) may also be performed at a high-temperature (e.g., around 80-500° C.). In the present embodiments, the NWELL ion implantation processes 404, which includes the four NWELL implants (NW1, NW2, NW3, NW4), leaves the plurality of fins 305, and the test structure 306, substantially free of as-implanted damage. In some cases, while the fins 305 and the test structure 306 may be substantially free of as-implanted damage, one or more interstitial clusters ($I_x$) may form during the NWELL ion implantation process 404, especially in larger active regions (e.g., such as within the test structure 306). As discussed in more detail below with reference to FIG. 8, such interstitial clusters may be completely removed from small geometry regions (e.g., the fins 305) upon annealing at an appropriate temperature. As used herein, "small geometry" is used to describe a fin geometry of about 10-20 nm. However, excess interstitial clusters within larger geometry regions (e.g., the test structure 306) may form dislocation loops upon annealing which may be readily detected via a metrology process such as by way of transmission electron microscopy (TEM).

In embodiments where the fins 305 include a first dielectric layer (e.g., pad oxide) over the fins 305, and a second dielectric layer (e.g., pad nitride) over the first dielectric layer, the NWELL ion implantation process 404 may be performed through the first and second dielectric layers, as in the example of FIG. 1A. In some embodiments, the second dielectric layer (e.g., pad nitride) may be removed prior to the NWELL ion implantation process 404. In some examples, both the second dielectric layer (e.g., pad nitride) and the first dielectric layer (e.g., pad oxide) may be removed prior to the NWELL ion implantation process 404. In various embodiments, both the second and first dielectric layers may be removed, and an oxide layer may be regrown over the fins 305, prior to the NWELL ion implantation process 404.

Figure 5:
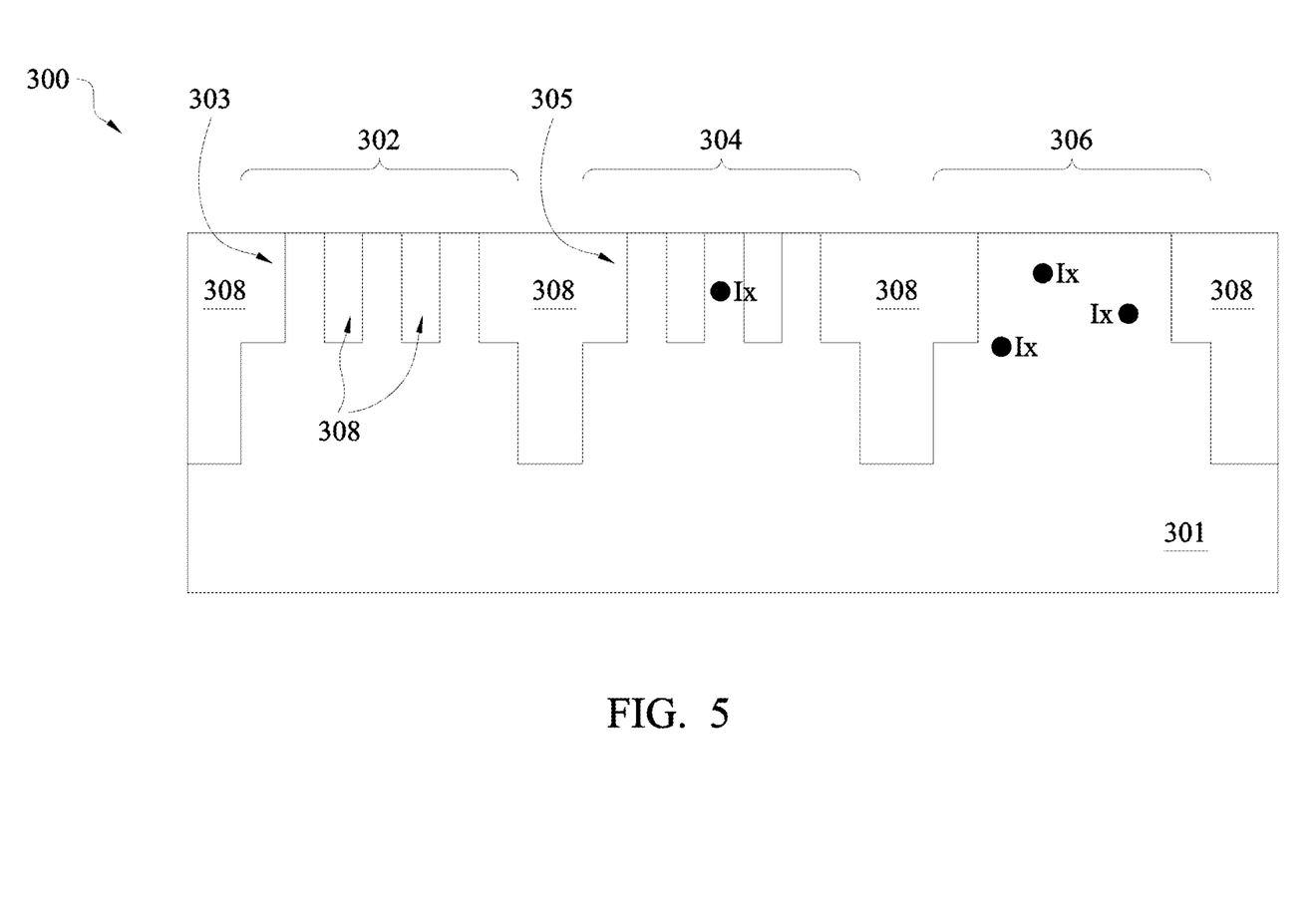
Figure 6:
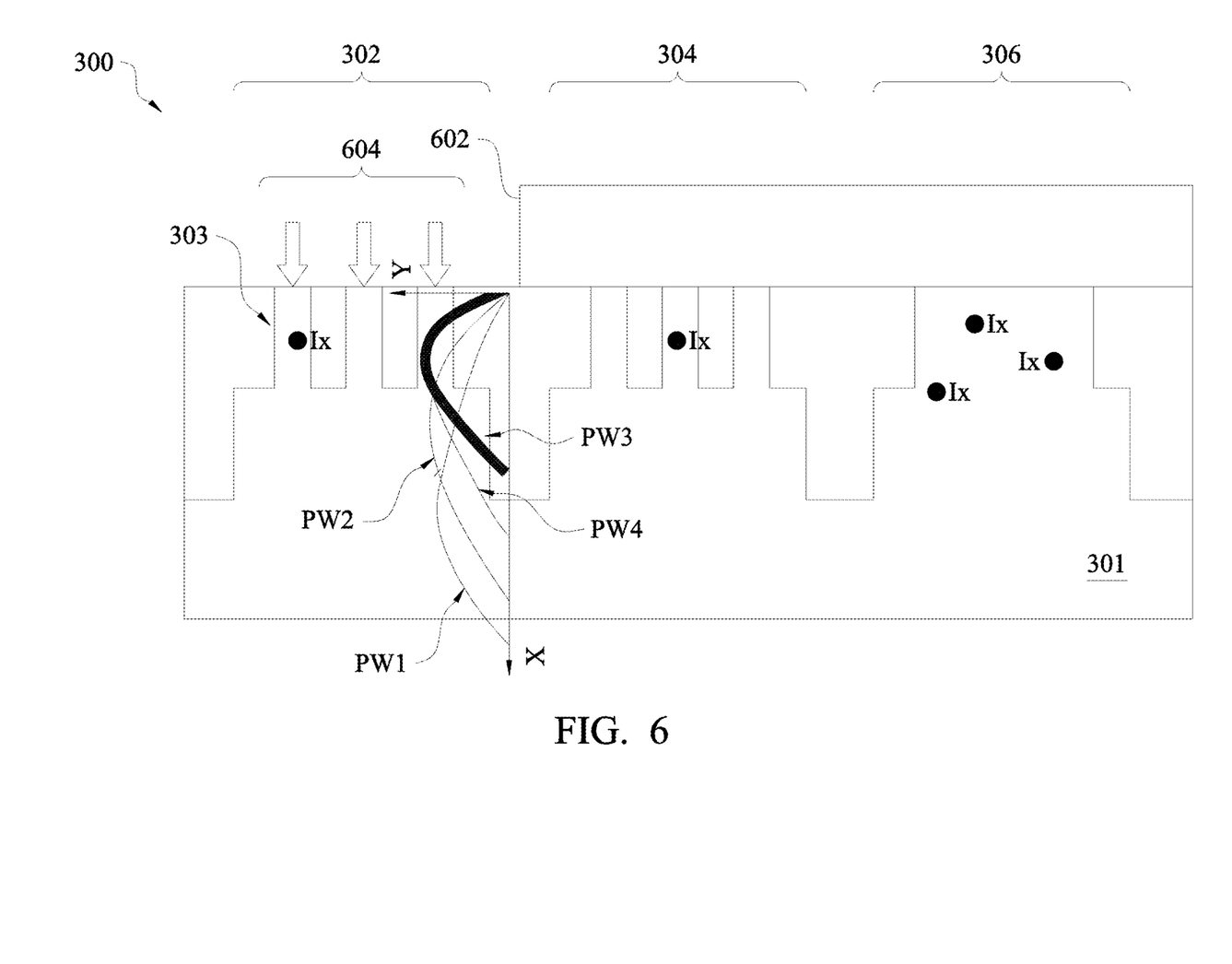

The method 200 then proceeds to block 206 where the HTM material, deposited and patterned at block 204, is stripped. Referring to the example of FIG. 5, in an embodiment of block 206, the HTM layer 402 (FIG. 4) has been stripped from the semiconductor device 300. In some embodiments, the HTM layer 402 is stripped by etching using a dry etch (e.g., reactive ion etching), a wet etch, and/or other suitable processes. In embodiments including topaz as the HTM layer 402, the HTM layer 402 may be stripped by using oxygen ($O_2$) plasma etching or hydrogen ($H_2$) plasma etching. In the example of FIG. 5, the one or more interstitial clusters ($I_x$) may still be present within one or more of the plurality of fins 305, and the test structure 306, after the HTM layer 402 is stripped. However, as discussed above, such interstitial clusters may be completely removed from small geometry regions (e.g., the fins 305) upon annealing and/or excess interstitial clusters within larger geometry regions (e.g., the test structure 306) may form dislocation loops upon annealing.

The method 200 then proceeds to block 208 where an HTM material is deposited and patterned. Referring to the example of FIG. 6, in an embodiment of block 208, an HTM layer 602 is deposited and patterned. In various embodiments, the HTM layer 602 may be substantially the same as the HTM layer 402 described above with reference to FIG. 4. Thus, in some embodiments, the HTM layer 602 may include topaz, an oxide, a nitride, or other heat-endurable material as known in the art. As for the HTM layer 402, the HTM layer 602 may be deposited by CVD, ALD, PVD, or other suitable process. In some examples, where topaz is used as the HTM layer 602, the HTM layer 602 may be deposited by a PECVD process using at least one of $C_2H_2$, $C_2H_6$, or $CH_4$, together with a mixture of $NH_3/H_2$ as a precursor gas. Additionally, depending on an ion implantation energy that is to be used in a subsequent process step, a thickness of the HTM layer 602 may be in a range of about 5-200 nm.

After deposition of the HTM layer 602, the HTM layer 602 is patterned according to a second well-type that is to be implanted. For example, in some embodiments, the second well-type to be implanted includes a PWELL. In some cases, the second well-type to be implanted may include an NWELL. Still referring to the example of FIG. 6, in an embodiment of block 208, the HTM layer 602 is patterned using a suitable photolithography and etch process. For example, the HTM layer 602 may be patterned such that the P-type fin region 304 (for PFETs/NWELL), and in some cases the test structure 306, are protected by the HTM layer 602, while the N-type fin region 302 (for NFETs/PWELL) is exposed. In some embodiments, the photolithography process used to pattern the HTM layer 602 may include forming a resist over the HTM layer 602, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate (i.e., the P-type fin region 304) while an etch process etches the HTM layer 602 in regions not protected by the masking layer (i.e., the N-type fin region 302). In some embodiments, the HTM layer 602 be etched using a dry etch (e.g., reactive ion etching), a wet etch, and/or other suitable processes. In embodiments including topaz as the HTM layer 602, the HTM layer 602 may be etched using an oxygen ($O_2$) plasma or hydrogen ($H_2$) plasma.

Still referring to block 208 of the method 200, block 208 further includes performing at least one ion implant corresponding to the second well-type by which the HTM layer 602 was patterned. With reference to the example of FIG. 6, which illustrates the HTM layer 602 patterned for a PWELL implant process (i.e., P-type fin region 304 is protected and the N-type fin region 302 is exposed), one or more PWELL ion implantation processes 604 are performed. For purposes of illustration, the example of FIG. 6 includes (X, Y) coordinate axes superimposed over the semiconductor device 300 to illustrate relative depths (in the X-direction) and magnitudes (in the Y-direction) for each of four PWELL implants (PW1, PW2, PW3, PW4). In some embodiments, at least one of the four PWELL implants (PW1, PW2, PW3, PW4) is performed at a temperature above room temperature (e.g., above around 25° C.) and within a range of about 80-500° C. Moreover, in the embodiments described herein, the HTM layer 602 is thermally stable within the range of temperatures (e.g., around 80-500° C.) that the device 300 may be subjected to during such high-temperature implantation processes. In some embodiments, implant PW1 is performed first, implant PW2 is performed second, implant PW3 is performed third, and implant PW4 is performed fourth. By way of example, and in some embodiments, implants PW1 and PW2 include well isolation implants, PW3 includes an APT implant, and PW4 includes a diffusion control implant. In some embodiments, implant PW1 includes a boron or boron fluoride ($BF_2$) implant performed at room temperature. In some examples, implant PW2 includes a boron or $BF_2$ implant performed at room temperature. In some embodiments, implant PW3 includes a boron or $BF_2$ implant performed within a temperature range between about 80-500° C. In some examples, implant PW4 includes a fluorine implant performed at room temperature. While some examples of implant conditions for each of the four PWELL implants (PW1, PW2, PW3, PW4) have been provided, it will be understood that other implant energies, dopant species, temperatures, and doses may be used without departing from the scope of the present disclosure. For example, in some embodiments, one of more of the four PWELL implants (PW1, PW2, PW3, PW4) may include other P-type dopant species such as boron difluoride, aluminum, gallium, indium, or other P-type material. In addition, in some embodiments, one or more of the four PWELL implants (PW1, PW2, PW3, PW4) may be used to perform an APT implant, a threshold voltage ($V_t$) adjust implant, a halo implant, or other suitable implant.

Similar to the NWELL implants discussed above with reference to FIG. 4, at least the APT implant (PW3) for the PWELL implants may be performed at a high-temperature (e.g., around 80-500° C.) to reduce and/or eliminate crystalline damage and/or residual dopant concentration within a FinFET channel. However, in some embodiments, one or more of the other implants (PW1, PW2, or PW4) may also be performed at a high-temperature (e.g., around 80-500° C.). In the present embodiments, the PWELL ion implantation processes 604, which includes the four PWELL implants (PW1, PW2, PW3, PW4), leaves the plurality of fins 303 substantially free of as-implanted damage. In some cases, while the fins 303 may be substantially free of as-implanted damage, one or more interstitial clusters ($I_x$) may form during the PWELL ion implantation process 604 (and especially in structures with larger active regions). As discussed in more detail below with reference to FIG. 8, such interstitial clusters may be completely removed from small geometry regions (e.g., the fins 303) upon annealing at an appropriate temperature. However, excess interstitial clusters within larger geometry regions may form dislocation loops upon annealing.

In embodiments where the fins 303 include a first dielectric layer (e.g., pad oxide) over the fins 303, and a second dielectric layer (e.g., pad nitride) over the first dielectric layer, the PWELL ion implantation process 604 may be performed through the first and second dielectric layers. In some embodiments, the second dielectric layer (e.g., pad nitride) may be removed prior to the PWELL ion implantation process 604. In some examples, both the second dielectric layer (e.g., pad nitride) and the first dielectric layer (e.g., pad oxide) may be removed prior to the PWELL ion implantation process 604. In various embodiments, both the second and first dielectric layers may be removed, and an oxide layer may be regrown over the fins 303, prior to the PWELL ion implantation process 604.

Figure 7:
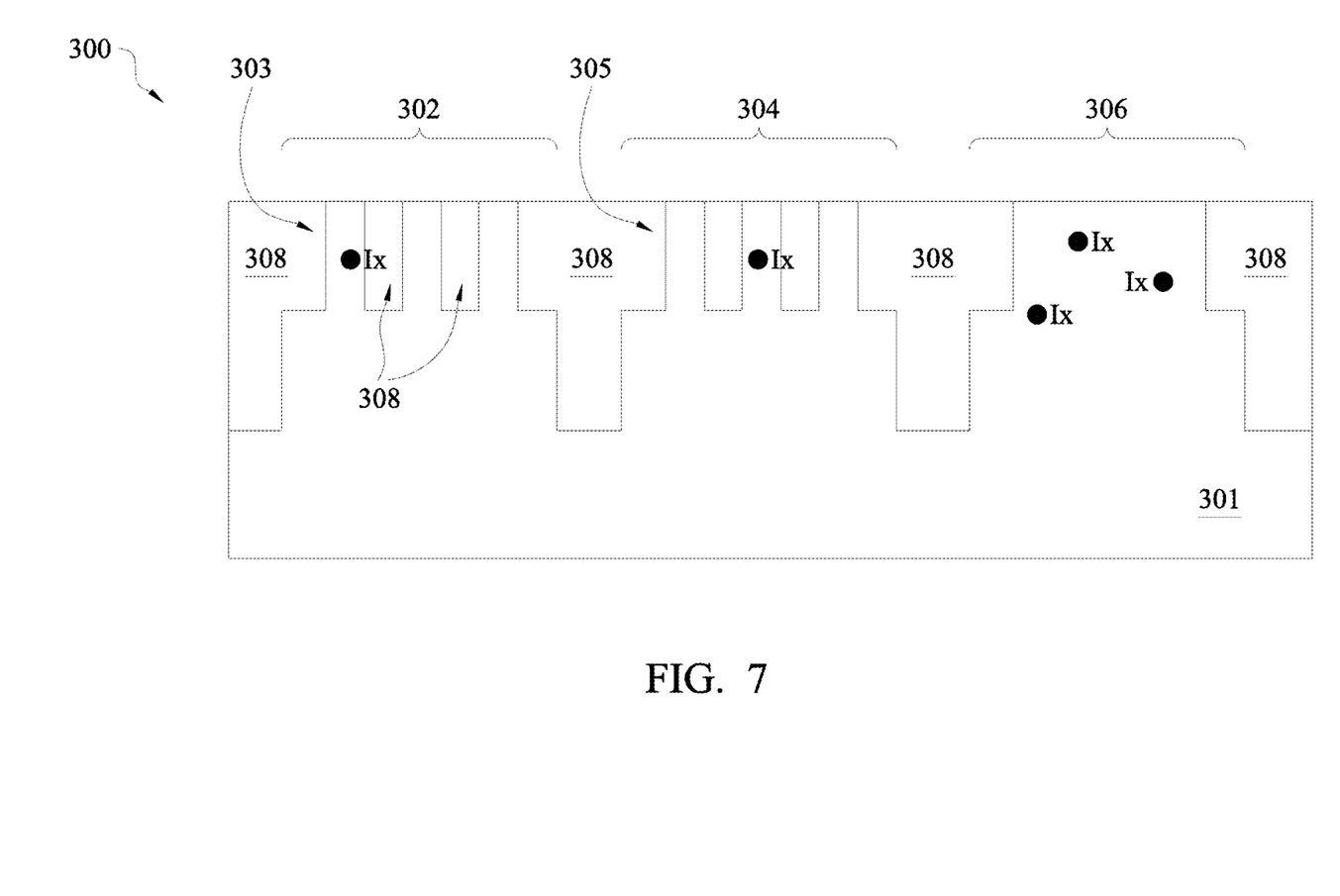

The method 200 then proceeds to block 210 where the HTM material, deposited and patterned at block 208, is stripped. Referring to the example of FIG. 7, in an embodiment of block 210, the HTM layer 602 (FIG. 6) has been stripped from the semiconductor device 300. In some embodiments, the HTM layer 602 is stripped by etching using a dry etch (e.g., reactive ion etching), a wet etch, and/or other suitable processes. In embodiments including topaz as the HTM layer 602, the HTM layer 602 may be stripped by using oxygen ($O_2$) plasma etching or hydrogen ($H_2$) plasma etching. In the example of FIG. 7, the one or more interstitial clusters ($I_x$) may still be present within one or more of the plurality of fins 303 after the HTM layer 602 is stripped.

Figure 8:
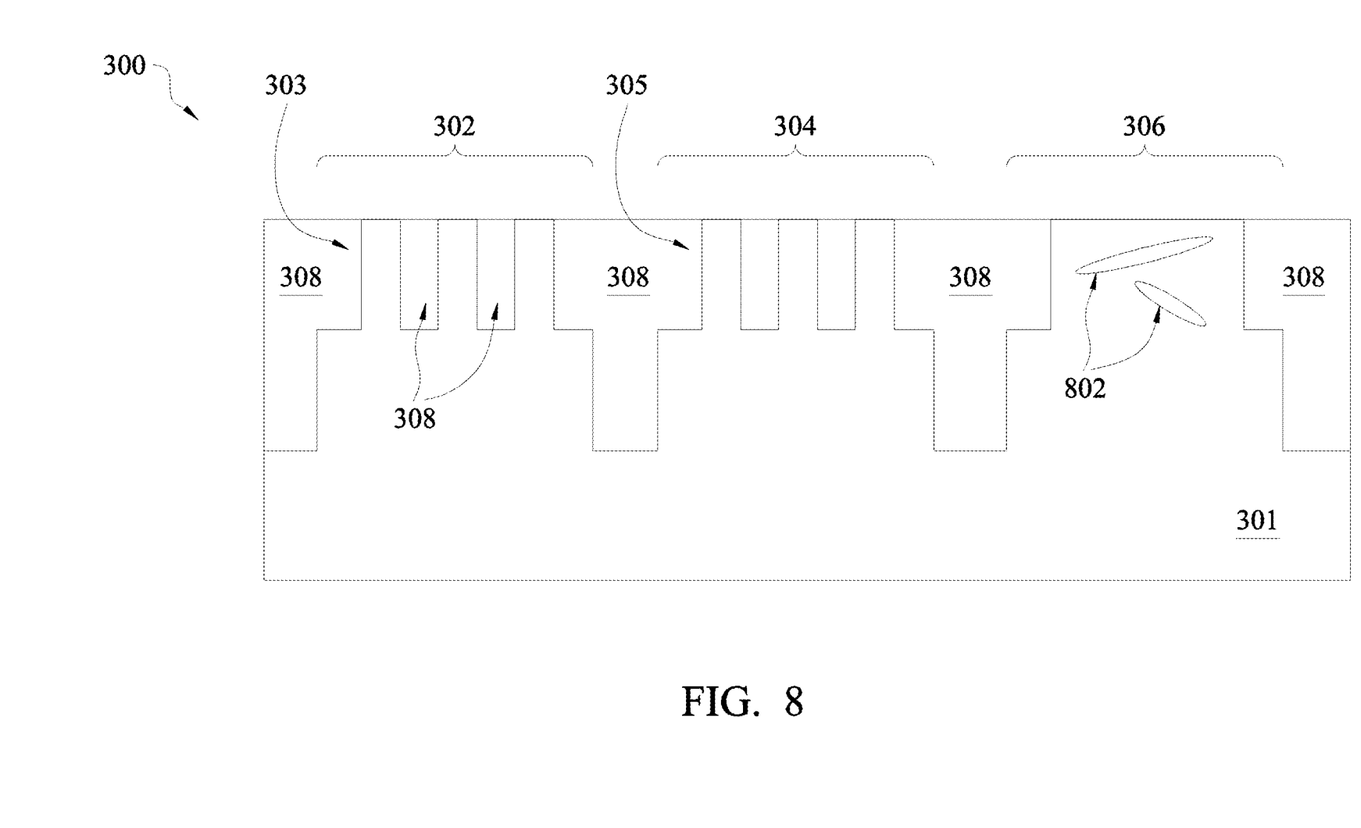
Figure 8A:
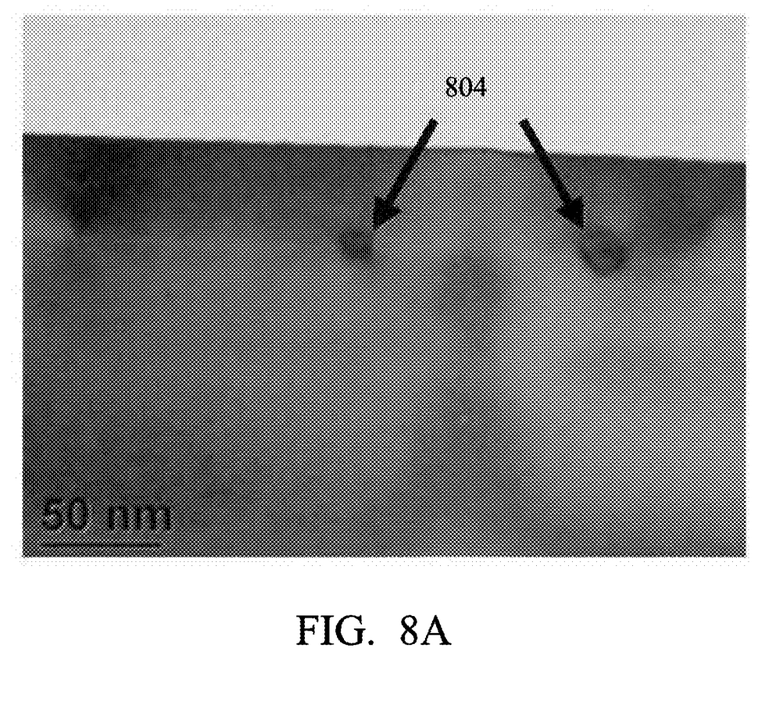
FIG. 8A illustrates an exemplary transmission electron microscopy (TEM) image of a portion of the device 300 illustrating dislocation loops.
Figure 9:
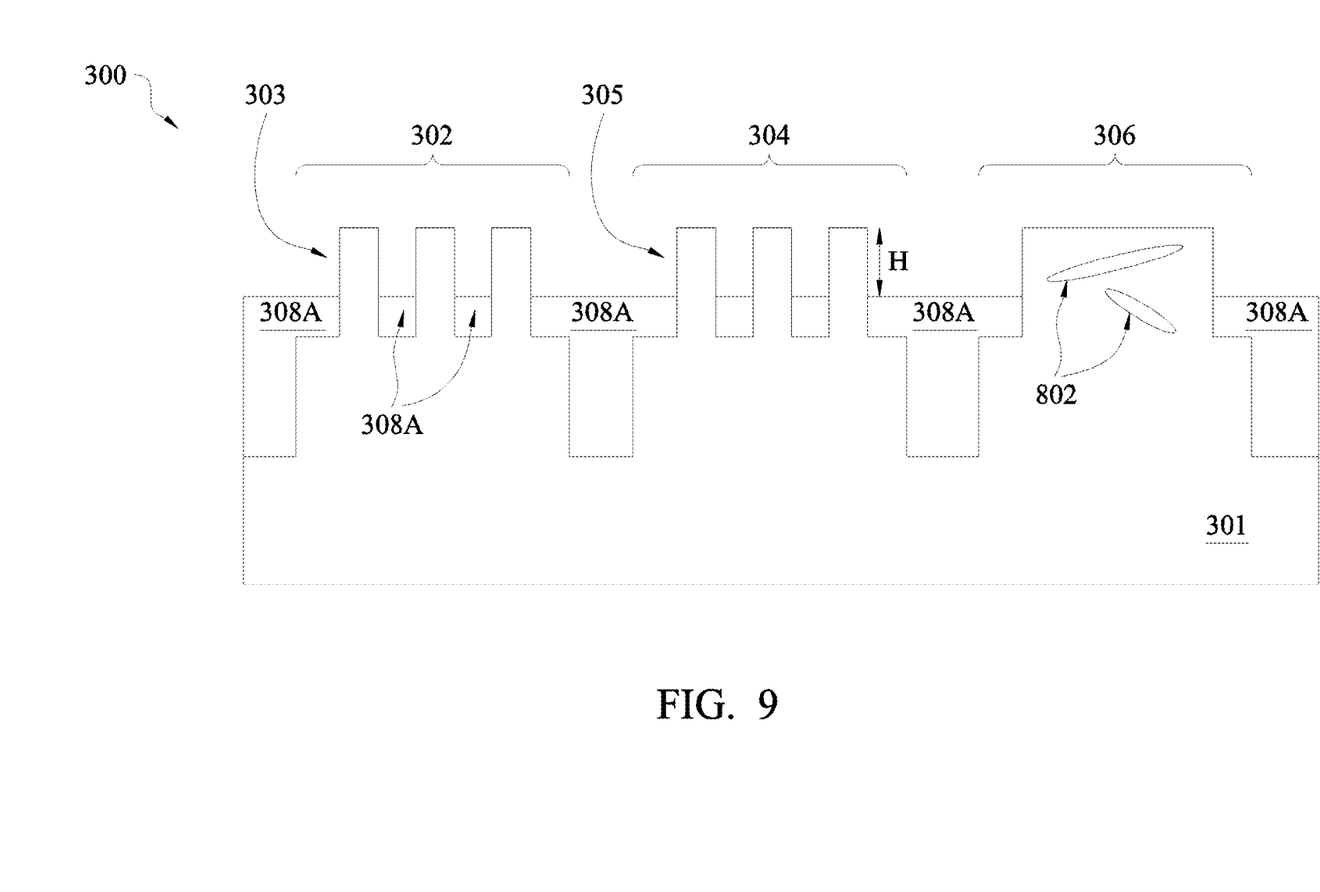

The method 200 then proceeds to block 212 where a well anneal is performed. Referring to the example of FIG. 8, in an embodiment of block 212, a well anneal may be performed at a temperature between about 1000-1100° C. In some examples, the well anneal may be performed for a duration of about 10 s. While some examples of well anneal temperature and duration have been given, these examples are merely exemplary and are not meant to be limiting in any way. Other anneal temperatures and/or durations may also be used in accordance with various process conditions and/or device requirements, as known in the art. As shown in the example of FIG. 8, the one or more interstitial clusters ($I_x$) present in either of the N- or P-type fin regions 302, 304, and formed during one of the NWELL or PWELL implantation processes 404, 604, may be completely removed from these small geometry regions upon annealing. Moreover, in various embodiments, dislocation loops are not be formed within the small geometry fins 303, 305 within the N- or P-type fin regions 302, 304. In contrast, as shown in the example of FIG. 8, excess interstitial clusters within larger geometry regions (e.g., the test structure 306) may form dislocation loops upon annealing, for example in regions 802. Such dislocation loops may be readily detected via a metrology process such as by way of transmission electron microscopy (TEM). By way of example, FIG. 8A shows a TEM image of a portion of the semiconductor device 300 including the regions 802. From the TEM image, the presence and/or absence of dislocation loops, such as dislocation loops 804, can be readily discerned. Thus, the removal of the one or more interstitial clusters ($I_x$) present in the fins 303, 305 of the N- or P-type fin regions 302, 304 provides a performance boost to devices fabricated in those regions (e.g., due to reduced scattering and increased mobility). Moreover, the easy detectability of the dislocation loops in larger geometry regions (e.g., the test structure 306), provides for easy detection of devices fabrication according to embodiments of the present disclosure.

The method 200 then proceeds to block 214 where the isolation regions are recessed. Referring to the example of FIG. 9, in an embodiment of block 214, the isolation regions 308 (FIG. 8) are recessed to laterally expose an upper portion of each of the fins 303, 305, and the test structure 306 and resulting in recessed isolation regions 308A. In some embodiments, the recessing process may include a dry etching process, a wet etching process, and/or a combination thereof. In some examples, a recessing depth is controlled (e.g., by controlling an etching time) so as to result in a desired height 'H' of the exposed upper portion.

The semiconductor device 300 may undergo further processing to form various features and regions known in the art. For example, subsequent processing may form gate stacks (e.g., high-K/metal gate stacks), sidewall spacers, source/drain features (e.g., epitaxially grown source/drain features), etch stop layer(s), interlayer dielectric (ILD) layer(s), contact openings, contact metal, as well as various contacts/vias/lines and multilayers interconnect features (e.g., metal layers and interlayer dielectrics) on the substrate 301, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

With respect to the description provided herein, the present disclosure offers methods and structures for avoiding degradation to semiconductor devices (e.g., FinFET devices) that can occur due to conventional ion implantation processes, including defect formation and the introduction of channel impurities (i.e., unwanted channel dopants). In some embodiments, a high-temperature ion implantation process is used to reduce and/or eliminate the crystalline damage to, and/or the residual dopant concentration within, a FinFET channel region. By doing so, embodiments of the present disclosure provide for enhanced device performance such as increased ON-state current, reduced series resistance, increased mobility, and reduced OFF-state current. In various embodiments, the high-temperature ion implantation process includes an ion implantation process performed at a temperature above room temperature (e.g., above around 25° C.) and within a range of about 80-500° C. In some embodiments, such high-temperature implants allow for the use of APT implants with a higher dose than may be used in a conventional APT implant process to more effectively reduce SCEs. In addition, embodiments of the present disclosure also provide for the use of a high-temperature mask (HTM) material suitable for use with the high-temperature ion implantation processes disclosed herein. In some embodiments, the HTM material includes topaz. However, in various examples, other heat-endurable materials may also be used (e.g., oxides, nitrides, etc.) as the HTM material. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a semiconductor device (e.g., a FinFET device) using a high-temperature ion implantation process. In some embodiments, the method includes providing a substrate having a plurality of fins extending from the substrate. By way of example, a first ion implantation process may be performed, at a first temperature, through a first group of fins of the plurality of fins. In some embodiments, a second ion implantation process is then performed, at a second temperature greater than the first temperature, through the first group of fins.

In another of the embodiments, discussed is a method where a substrate including a plurality of fins extending therefrom is provided. In some examples, a first mask material is deposited and patterned to expose a first group of fins of the plurality of fins. In some cases, the first mask material may include topaz or other heat-endurable material as known in the art. In various embodiments, a test structure (e.g., a SIMS pad) may also be exposed. By way of example, a first ion implantation may be performed, at a first temperature, through the first group of fins of the plurality of fins and through the test structure. Additionally, a second ion implantation may be performed, at a second temperature greater than the first temperature, through the first group of fins of the plurality of fins and through the test structure. In various examples, at least one interstitial cluster is formed within the first group of fins and within the test structure.

In yet another of the embodiments, discussed is a semiconductor device including a substrate having a first fin region and a test structure adjacent to the first fin region. In some examples, the first fin region includes an implanted first dopant species and the test structure includes an implanted second dopant species. In various embodiments, at least one dislocation loop is formed within the test structure. In some examples, the semiconductor device further includes a second fin region having an implanted third dopant species. In some embodiments, the implanted first and second dopant species are the same dopant species. In some examples, the implanted second and third dopant species are the same dopant species.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   providing a substrate including a plurality of fins extending therefrom;
   forming a plurality of isolation regions interposing the plurality of fins, wherein a top surface of each of the plurality of isolation regions and a top surface of each of the plurality of fins form a planar surface;
   performing a first ion implantation, at a first temperature, through a first group of fins of the plurality of fins;
   performing a second ion implantation, at a second temperature greater than the first temperature, through the first group of fins; and
   after performing the first and second ion implantations, recessing the plurality of isolation regions to laterally expose an upper portion of each of the plurality of fins.

2. The method of claim 1, wherein the first temperature is about 25° C. and the second temperature is selected from a range of about 80° C. to about 500° C.

3. The method of claim 1, wherein the second ion implantation includes an anti-punch-through (APT) implant.

4. The method of claim 1, further comprising:
   prior to performing the first ion implantation, depositing a first mask material; and
   patterning the first mask material for a first type of well implant, wherein the patterning the first mask material exposes the first group of fins.

5. The method of claim 4, further comprising:
   stripping the patterned first mask material;
   depositing a second mask material; and
   patterning the second mask material for a second type of well implant, wherein the patterning the second mask material exposes a second group of fins of the plurality of fins.

6. The method of claim 5, wherein the first mask material and the second mask material include topaz.

7. The method of claim 5, wherein the first and second types of well implants include one of an NWELL implant and a PWELL implant.

8. The method of claim 5, further comprising:
   performing a third ion implantation, at the first temperature, through the second group of fins; and
   performing a fourth ion implantation, at the second temperature greater than the first temperature, through the second group of fins.

9. The method of claim 1, further comprising performing a well anneal process.

10. A method of semiconductor device fabrication, comprising:
    providing a substrate including a plurality of fins extending therefrom, wherein a plurality of isolation regions interpose the plurality of fins;
    depositing a first mask material and patterning the first mask material to expose a first group of fins of the plurality of fins and a test structure;
    performing a first ion implantation, at a first temperature, through the first group of fins of the plurality of fins and the test structure;

performing a second ion implantation, at a second temperature greater than the first temperature, through the first group of fins of the plurality of fins and the test structure; and after performing the first and second ion implantations, recessing the plurality of isolation regions to laterally expose an upper portion of each of the plurality of fins;

wherein at least one interstitial cluster is formed within the first group of fins and within the test structure.

11. The method of claim 10, further comprising:
stripping the patterned first mask material;
depositing a second mask material and patterning the second mask material to expose a second group of fins of the plurality of fins;
performing a third ion implantation, at the first temperature, through the second group of fins of the plurality of fins; and
performing a fourth ion implantation, at the second temperature greater than the first temperature, through the second group of fins of the plurality of fins;
wherein at least one interstitial cluster is formed within the second group of fins.

12. The method of claim 10, wherein the first temperature is about 25° C. and the second temperature is selected from a range of about 80° C. to about 500° C.

13. The method of claim 11, wherein the second and fourth ion implantations include an anti-punch-through (APT) implant.

14. The method of claim 11, further comprising:
performing a well anneal process;
by the well anneal process, removing the at least one interstitial cluster from each of the first and second group of fins; and
by the well anneal process, forming at least one dislocation loop within the test structure.

15. The method of claim 11, wherein the first, second, third, and fourth ion implantations include at least one dopant selected from the group comprising: arsenic; phosphorous; antimony; boron; boron difluoride; aluminum; gallium; indium; and fluorine.

16. A method of semiconductor device fabrication, comprising:
providing a substrate having a first fin region, a second fin region adjacent to the first fin region, a test structure adjacent to one of the first and second fin regions, and a plurality of isolation regions interposing the first fin region, the second fin region, and the test structure;
while masking the second fin region, performing first and second ion implants of a first dopant species into the first fin region and the test structure, wherein the second ion implant is performed at a higher temperature than the first ion implant;
while masking the first fin region and the test structure, performing third and fourth ion implants of a second dopant species into the second fin region, wherein the fourth ion implant is performed at a higher temperature than the third ion implant;
after performing the first, second, third, and fourth ion implants, performing a well anneal process; and
after performing the well anneal process, recessing the plurality of isolation regions to laterally expose an upper portion of each of the first fin region, the second fin region, and the test structure.

17. The method of claim 16, wherein the first and second fin regions each include a plurality of fin structures with widths from around 10-20 nm, and wherein the test structure includes a fin structure with a width greater than about 100 nm.

18. The method of claim 16, wherein the first and third ion implants are performed at room temperature and the second and fourth ion implants are performed at a temperature higher than room temperature.

19. The method of claim 16, wherein the performing the well anneal process forms at least one detectable defect including a dislocation loop within the test structure.

20. The method of claim 16, wherein the first and second dopant species include at least one dopant selected from the group comprising: arsenic; phosphorous; antimony; boron; boron difluoride; aluminum; gallium; indium; and fluorine.

* * * * *